US009417960B2

United States Patent
Cai et al.

(10) Patent No.: US 9,417,960 B2
(45) Date of Patent: Aug. 16, 2016

(54) PREVENTING PROGRAMMING ERRORS FROM OCCURRING WHEN PROGRAMMING FLASH MEMORY CELLS

(71) Applicant: Seagate Technology LLC, Cupertino, CA (US)

(72) Inventors: Yu Cai, San Jose, CA (US); Yunxiang Wu, Cupertino, CA (US); Zhengang Chen, San Jose, CA (US); Erich Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 18 days.

(21) Appl. No.: 14/147,825

(22) Filed: Jan. 6, 2014

(65) Prior Publication Data

US 2015/0178152 A1    Jun. 25, 2015

Related U.S. Application Data

(60) Provisional application No. 61/918,778, filed on Dec. 20, 2013.

(51) Int. Cl.

| | | |
|---|---|---|
| *G11C 29/00* | (2006.01) | |
| *G06F 11/10* | (2006.01) | |
| *H03M 13/29* | (2006.01) | |
| *H03M 13/35* | (2006.01) | |
| *G11C 5/14* | (2006.01) | |
| *G11C 16/30* | (2006.01) | |
| *H03M 13/11* | (2006.01) | |
| *H03M 13/15* | (2006.01) | |
| *G11C 29/04* | (2006.01) | |

(52) U.S. Cl.
CPC ............ *G06F 11/1072* (2013.01); *G11C 5/147* (2013.01); *G11C 16/30* (2013.01); *H03M 13/2906* (2013.01); *H03M 13/356* (2013.01); *G11C 2029/0411* (2013.01); *H03M 13/1102* (2013.01); *H03M 13/152* (2013.01)

(58) Field of Classification Search
CPC .... G11C 29/52; G11C 11/5642; G11C 16/30; G11C 16/10; G11C 5/147; G06F 11/108; G06F 11/1072; G06F 11/1068
See application file for complete search history.

(56) References Cited

U.S. PATENT DOCUMENTS

| | | | | |
|---|---|---|---|---|
| 7,602,642 | B2 | 10/2009 | Choi | |
| 8,291,295 | B2 * | 10/2012 | Harari et al. | 714/763 |
| 8,935,466 | B2 * | 1/2015 | Ellis | 711/106 |

(Continued)

OTHER PUBLICATIONS

Doe Hyun Yoon and Mattan Erez, Memory Mapped ECC Low-Cost Error Protection for Last Level Caches, The University of Texas at Austin Electrical & Computer Engineering, Jun. 2009, 32 pages, ACM publisher.

(Continued)

*Primary Examiner* — Shelly A Chase
(74) *Attorney, Agent, or Firm* — Robert A. Blaha; Smith Tempel Blaha LLC

(57) ABSTRACT

Mis-programming of MSB data in flash memory is prevented by using ECC decoding logic on the flash die that error corrects the LSB values prior to the LSB values being used in conjunction with the MSB values to determine the proper reference voltage ranges. Error correcting the LSB page data prior to using it in combination with the MSB page data to determine the reference voltage ranges ensures that the reference voltage ranges will be properly determined and programmed into the flash cells.

21 Claims, 9 Drawing Sheets

(56) References Cited

U.S. PATENT DOCUMENTS

| | | | |
|---|---|---|---|
| 8,935,595 B2* | 1/2015 | Zhong et al. | 714/773 |
| 2012/0134207 A1* | 5/2012 | Yoon et al. | 365/185.03 |
| 2014/0006898 A1* | 1/2014 | Sharon et al. | 714/755 |
| 2014/0136927 A1* | 5/2014 | Li et al. | 714/768 |
| 2014/0281819 A1* | 9/2014 | Wood et al. | 714/773 |

OTHER PUBLICATIONS

Aniruddha N. Udipi, Naveen Muralimanohar, Rajeev Balasubramonian, Al Davis and Norman P. Jouppi, LOT-ECC: LOcalized and Tiered Reliability Mechanisms for Commodity Memory Systems, University of Utah HP Labs, Jun. 2012, 12 pages, IEEE.

* cited by examiner

PREVENTING PROGRAMMING ERRORS FROM OCCURRING WHEN PROGRAMMING FLASH MEMORY CELLS

CROSS-REFERENCE TO RELATED APPLICATIONS

This nonprovisional application claims priority to provisional application Ser. No. 61/918,778, filed on Dec. 20, 2013, and entitled "PREVENTING PROGRAMMING ERRORS FROM OCCURRING WHEN PROGRAMMING FLASH MEMORY CELLS," which is incorporated by reference herein in its entirety.

TECHNICAL FIELD OF INVENTION

The invention relates generally to flash memory and, more specifically, to preventing programming errors from occurring when programming flash memory cells.

BACKGROUND OF THE INVENTION

A flash memory is a non-volatile electrically erasable data storage device that evolved from electrically erasable programmable read-only memory (EEPROM). The two main types of flash memory are named after the logic gates that their storage cells resemble: NAND and NOR. NAND flash memory is commonly used in solid-state drives, which are supplanting magnetic disk drives in many applications. A NAND flash memory is commonly organized as multiple blocks, with each block organized as multiple pages. Each page comprises multiple cells. Each cell is capable of storing an electric charge. Some cells are used for storing data bits, while other cells are used for storing error-correcting code bits. A cell configured to store a single bit is known as a single-level cell (SLC). A cell configured to store two bits is known as a multi-level cell (MLC). In an MLC cell, one bit is commonly referred to as the least-significant bit (LSB), and the other as the most-significant bit (MSB). A cell configured to store three bits is known as a triple-level cell (TLC). Writing data to a flash memory is commonly referred to as "programming" the flash memory, due to the similarity to programming an EEPROM.

The electric charge stored in a cell can be detected in the form of a cell voltage. To read an SLC flash memory cell, the flash memory controller provides one or more reference voltages (also referred to as read voltages) to the flash memory device. Detection circuitry in the flash memory device will interpret the bit as a "0" if the cell voltage is greater than a reference voltage Vref and will interpret the bit as a "1" if the cell voltage is less than the reference voltage Vref. Thus, an SLC flash memory requires a single reference voltage Vref. In contrast, an MLC flash memory requires three such reference voltages, and a TLC flash memory requires seven such reference voltages. Thus, reading data from an MLC or TLC flash memory device requires that the controller provide multiple reference voltages having optimal values that allow the memory device to correctly detect the stored data values.

Determining or detecting stored data values using controller-provided reference voltages is hampered by undesirable physical non-uniformity across cells of a device that are inevitably introduced by the fabrication process, as such non-uniformity results in the reference voltages of different cells that store the same bit value being significantly different from each other. The detection is further hampered by target or optimal reference voltages changing over time due to adverse effects of changes in temperature, interference from programming neighboring cells, and numerous erase-program cycles. Errors in detecting stored data values are reflected in the performance measurement known as bit error rate (BER). The use of error-correcting codes (ECCs) can improve BER to some extent, but the effectiveness of ECCs diminishes as improved fabrication processes result in smaller cell features.

As illustrated in FIG. 1, an MLC flash memory has four cell voltage distributions 2, 4, 6 and 8 with four respective mean target cell voltages Vtarget0 12, Vtarget1 14, Vtarget2 16 and Vtarget3 18. Such cell voltage distributions commonly overlap each other slightly, but such overlap is not shown in FIG. 1 for purposes of clarity. During a read operation, to attempt to characterize or detect the two bits of cell data (i.e., the LSB and MSB) a flash memory device (not shown) uses three reference voltages it receives from a flash memory controller (not shown): Vref0 22, Vref1 24 and Vref2 26. More specifically, the flash memory device compares the cell voltage with Vref1 24 to attempt to detect the LSB. If the flash memory device determines that the cell voltage is less than Vref1 24, i.e., within a window 28, then the flash memory device characterizes the LSB as a "1". If the flash memory device determines that the cell voltage is greater than Vref1 24, i.e., within a window 30, then the flash memory device characterizes the LSB as a "0".

The flash memory device also compares the cell voltage with Vref0 22 and Vref2 26 to attempt to detect the MSB. If the flash memory device determines that the cell voltage is between Vref0 22 and Vref2 26, i.e., within a window 32, then the flash memory device characterizes the MSB as a "0". If the flash memory device determines that the cell voltage is either less than Vref0 22 or greater than Vref2 26, i.e., within a window 34, then the flash memory device characterizes the MSB as a "1".

To improve BER beyond what is commonly achievable with hard-decision decoded ECCs, flash memory controllers may employ soft-decision decoded ECCs, such as low density parity check (LDPC) ECCs. Soft-decision decoding is more powerful in correcting errors than hard-decision decoding, but soft input information must be provided to the ECC decoding logic. The ECC decoder soft input information is commonly provided in the form of log likelihood ratio (LLR) information.

MLC NAND flash memory is programmed in two stages, namely, a first stage during which LSB page programming is performed, and a second stage during which MSB page programming is performed. The first stage includes the following: (1) the flash memory controller sends LSB data to flash memory; (2) the flash memory loads the LSB data into an LSB page buffer portion of the flash memory; and (3) the flash memory uses the LSB data to program the corresponding LSB page of the flash memory. The second stage includes the following: (1) the flash memory controller sends the MSB data to be programmed to flash memory; (2) the flash memory loads the MSB data into an MSB page buffer portion of the flash memory; (3) logic of the flash memory reads the LSB page of the corresponding flash cells and loads the read LSB data into the LSB page buffer portion; (4) the logic uses the MSB and LSB value pairs held in the flash page buffer to determine the target reference voltage ranges to be programmed for the corresponding flash cells; and (5) the logic programs the target reference voltage ranges into the flash memory.

As flash memory technology improves, the sizes of the flash dies scale down, which results in the distance between neighboring flash cells becoming smaller. Because of the nearness of neighboring flash cells to one another, the programming of one flash cell can affect the charges stored on nearby flash cells, which contributes to the potentially noisy and unreliable nature of flash cells. Consequently, there can be errors in the LSB page data read out of the corresponding flash cells. Because the LSB page data read out of the flash cells is used in combination with the MSB page data to determine the target reference voltage ranges for the corresponding cells, such errors will typically cause the target reference voltage ranges to be incorrectly determined. This can cause the flash cells to be mis-programmed to improper reference voltage ranges when performing MSB page programming. The improper reference voltage ranges often will be far away from the borders of flash neighbor states and could provide incorrect, but highly confident, soft information. This, in turn, can significantly degrade the error correction performance of soft-decision decoding, such as LDPC decoding.

FIG. 2 illustrates cell voltage distributions and target reference voltage ranges for different LSB and MSB states and demonstrates the manner in which the reference voltage ranges are selected based on the values of the MSB and LSB pair. Cell voltage distribution 42 represents the LSB and MSB erased program state. Cell distributions 43 and 44 represent LSB "1" and "0" programmed states, respectively. Cell distributions 45, 46, 47, and 48 represent MSB programmed states of "1," "0," "0," and "1," respectively.

If the MSB and LSB values of the MSB, LSB pair contained in the flash page buffer are both "1," then the reference voltage range that will be programmed into the flash memory for the corresponding flash cells is selected to be range A, which is the range of reference voltages that is less than Vref0. If the MSB and LSB values of the MSB, LSB pair contained in the flash page buffer are "1" and "0," respectively, then the reference voltage range that will be programmed into the flash memory device for the corresponding flash cells is selected to be range D, which is the range of reference voltages that is greater than Vref2. If the MSB and LSB values of the MSB, LSB pair contained in the flash page buffer are "0" and "1," respectively, then the reference voltage range that will be programmed into the flash memory device for the corresponding flash cells is selected to be range B, which is the range of reference voltages that is greater than Vref0 and less than Vref1.

As can be seen from the above, if the LSB values that are read from the flash memory cells are inaccurate, which is possible for the reasons described above, then the reference voltage ranges will likely be mis-programmed. Accordingly, a need exists for a way to ensure that the reference voltage ranges are correctly determined and programmed.

SUMMARY OF THE INVENTION

Embodiments of the invention relate to a data storage system, a flash memory IC for use in the data storage system, and methods used therein for preventing programming errors from occurring when programming flash memory. In accordance with an illustrative embodiment, the data storage system comprises a host system and a solid state drive (SSD) that are interfaced with one another. The SSD includes an SSD controller and at least one nonvolatile memory (NVM). The SSD controller includes at least one SSD processor, a tier 1 error-correcting ECC encoder/decoder, and a tier 2 ECC encoder/decoder. The NVM includes at least a first flash memory having a plurality of flash memory cells, reference voltage range determination logic and tier 2 ECC decoding logic. The SSD controller receives write data from the host system to be programmed into flash cells of the NVM. The write data comprises at least a first MSB page of data and at least a first LSB page of data. The tier 1 ECC encoder/decoder performs tier 1 ECC encoding of the first LSB page of data to produce a tier 1-encoded first LSB page of data. The tier 2 ECC encoder/decoder performs tier 2 ECC encoding of the tier 1-encoded first LSB page of data to produce a tier 1/tier 2-encoded first LSB page data. The SSD controller sends the tier 1/tier 2-encoded first LSB page of data to the first flash memory. The tier 1 ECC encoding/decoding logic performs tier 1 ECC encoding of the first MSB page of data to produce a tier 1-encoded first MSB page of data. The SSD controller sends the tier 1-encoded first MSB page of data to the first flash memory. The tier 1 ECC encoding and the tier 2 encoding are different types of encoding. The tier 2 decoding logic of the first flash memory is adapted to perform tier 2 decoding of LSB page data in the first flash memory. The tier 2-decoded first LSB page of data is subsequently used in conjunction with the tier 1-encoded MSB page data in the first flash memory to determine reference voltage ranges for the flash memory cells In accordance with an illustrative embodiment, the flash memory IC die comprises a plurality of flash memory cells for storing data and ECC decoding logic. The flash memory IC die is configured to receive write data from an interface that interfaces an SSD controller with the first flash memory IC die. The received write data comprises at least a first LSB page of data and at least a first MSB page of data. The first LSB page of data is encoded with a tier 1 ECC encoding and with a tier 2 ECC encoding. The first MSB page of data is encoded with the tier 1 encoding. The flash memory IC die programs the first LSB page of data to a first LSB page of the flash memory cells. Prior to the first flash memory IC die programming the first MSB page of data to a first MSB page of the flash memory cells, the first flash memory IC die causes the encoded first LSB page of data to be read from the first LSB page of the flash memory cells and sent to the ECC decoding logic. The ECC decoding logic performs tier 2 ECC decoding of the encoded LSB page data to produce a tier 2-decoded first LSB page of data that is subsequently used in conjunction with the tier 1-encoded MSB page data to determine reference voltage ranges for the flash memory cells.

These and other features and advantages of the invention will become apparent from the following description, drawings and claims.

DETAILED DESCRIPTION OF AN ILLUSTRATIVE EMBODIMENT

Figure 1:
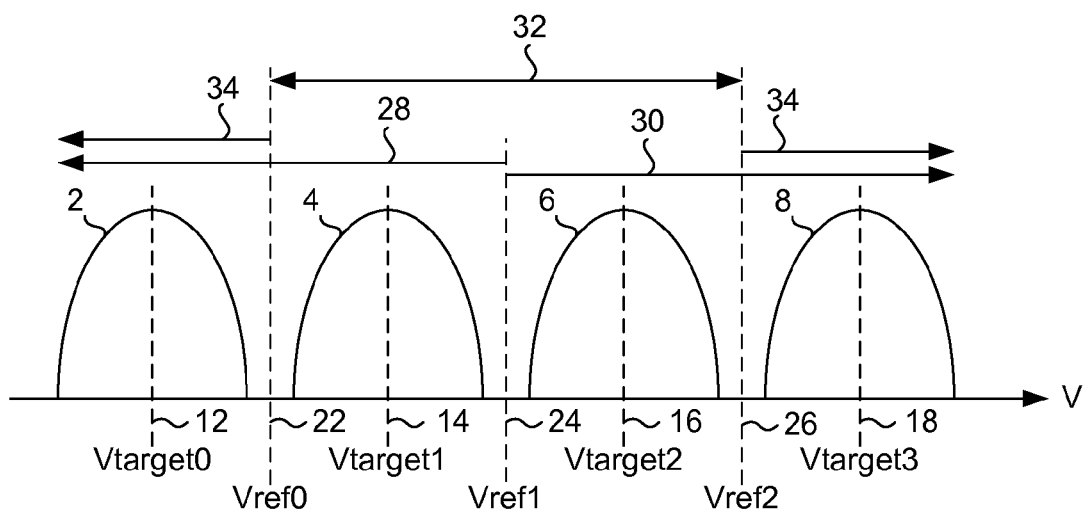
FIG. 1 is a plot of cell voltage distributions in a flash memory device, as known in the art, and demonstrates the known manner in which LSB and MSB values are determined.

In accordance with exemplary, or illustrative, embodiments, the LSB values that are used in conjunction with the MSB values to determine the proper reference voltage ranges are error corrected by ECC decoding logic inside of the flash memory before being used in conjunction with the MSB values to determine the proper reference voltage ranges. Error correcting the LSB page data prior to using it in combination with the MSB page data to determine the reference voltage ranges ensures that the reference voltage ranges will be properly determined and programmed into the flash cells.

Embodiments of the invention can be implemented in a number of ways, and therefore a few illustrative embodiments are described below with reference to FIGS. 3-9, in which like reference numerals in the figures identify like features, components or elements. Before describing specific embodiments for ensuring that programming errors do not occur when programming the reference voltage ranges of the flash cells, the components of the storage system in accordance with an illustrative embodiment and the functions that they perform will be generally described with reference to FIGS. 3 and 4.

Figure 3:
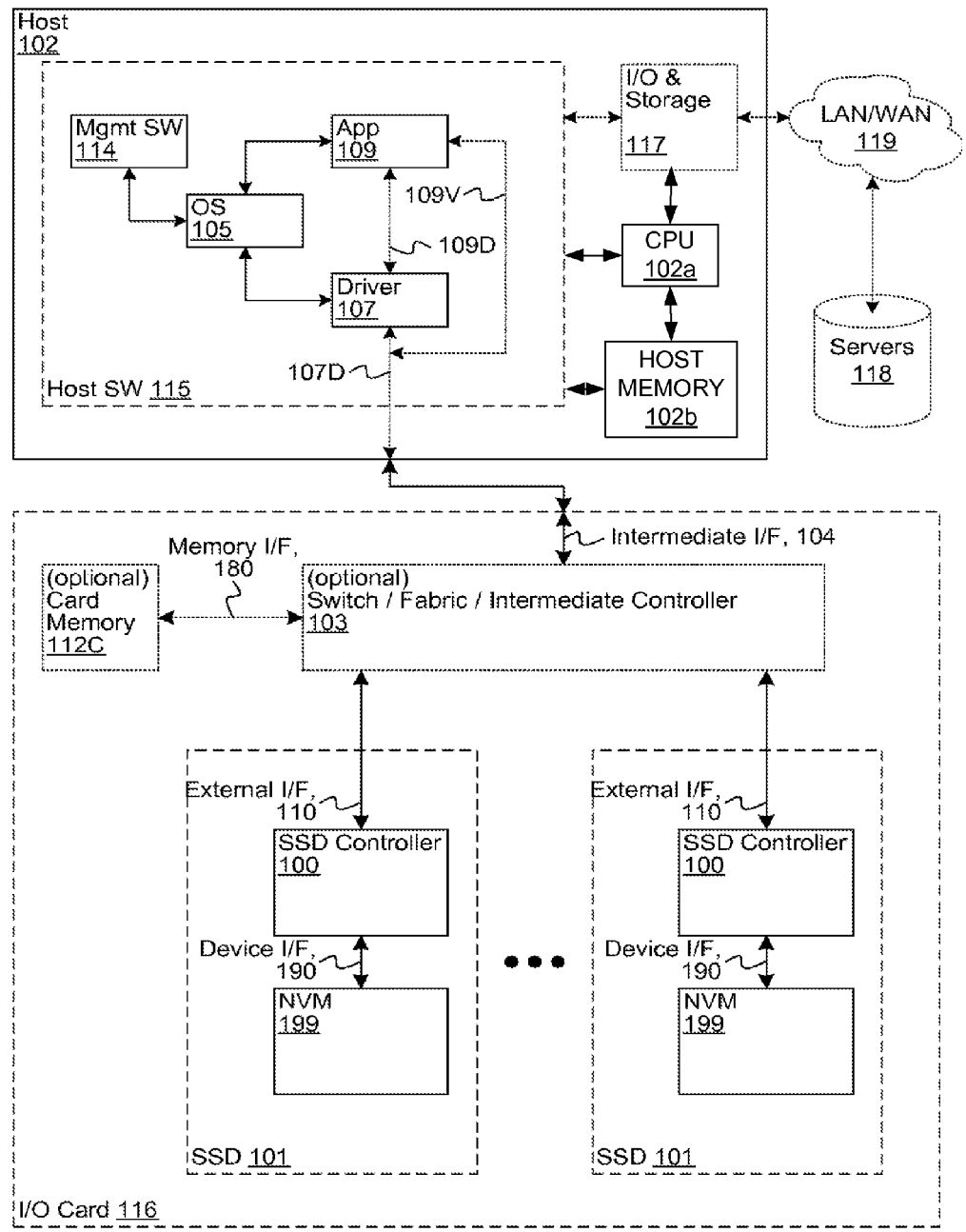
FIG. 3 illustrates a block diagram of a storage system in accordance with an illustrative embodiment that includes one or more instances of an SSD device that is suitable for implementing the invention.

FIG. 3 illustrates a block diagram of a storage system in accordance with an illustrative embodiment that includes one or more instances of a solid state drive (SSD) 101 that implements the invention. The SSD 101 includes an SSD controller 100 coupled to NVM 199 via device interfaces 190. As will be described below in more detail with reference to FIG. 4, the NVM 199 comprises one or more flash memory dies, each of which comprises a plurality of flash cells. The storage system may include, for example, a host system 102, a single SSD 101 coupled directly to the host system 102, a plurality of SSDs 101 each respectively coupled directly to the host system 102 via respective external interfaces, or one or more SSDs 101 coupled indirectly to a host system 102 via various interconnection elements. As an exemplary embodiment of a single SSD 101 coupled directly to the host system 102, one instance of SSD 101 is coupled directly to host system 102 via external interfaces 110 (e.g., switch/fabric/intermediate controller 103 is omitted, bypassed, or passed-through).

As an exemplary embodiment of a plurality of SSDs 101 being coupled directly to the host system 102 via respective external interfaces, each of a plurality of instances of SSD 101 is respectively coupled directly to host system 102 via a respective instance of external interfaces 110 (e.g., switch/fabric/intermediate controller 103 is omitted, bypassed, or passed-through). As an exemplary embodiment of one or more SSDs 101 coupled indirectly to host system 102 via various interconnection elements, each of one or more instances of SSD 101 is respectively coupled indirectly to host system 102 via a respective instance of external interfaces 110 coupled to switch/fabric/intermediate controller 103, and intermediate interfaces 104 coupled to host system 102.

The host system 102 includes one or more processors, such as, for example, one or more microprocessors and/or microcontrollers operating as a central processing unit (CPU) 102a, and a host memory device 102b for storing instructions and data used by the host CPU 102a. Host system 102 is enabled or configured via the host CPU 102a to execute various elements of host software 115, such as various combinations of operating system (OS) 105, driver 107, application 109, and multi-device management software 114. The host software 115 is stored in a memory device 102b of the host system 102 and is executed by the host CPU 102a. Dotted-arrow 107D is representative of host software ←→ I/O device communication, e.g., data sent/received to/from one or more of the instances of SSD 101 and from/to any one or more of OS 105 via driver 107, driver 107, and application 109, either via driver 107, or directly as a VF.

OS 105 includes and/or is enabled or configured to operate with drivers (illustrated conceptually by driver 107) for interfacing with the SSD. Various versions of Windows (e.g., 95, 98, ME, NT, XP, 2000, Server, Vista, and 7), various versions of Linux (e.g., Red Hat, Debian, and Ubuntu), and various versions of MacOS (e.g., 8, 9 and X) are examples of OS 105. In various embodiments, the drivers are standard and/or generic drivers (sometimes termed "shrink-wrapped" or "pre-installed") operable with a standard interface and/or protocol such as SATA, AHCI, or NVM Express, or are optionally customized and/or vendor specific to enable use of commands specific to SSD 101.

Some drives and/or drivers have pass-through modes to enable application-level programs, such as application 109 via optimized NAND Access (sometimes termed ONA) or direct NAND Access (sometimes termed DNA) techniques, to communicate commands directly to SSD 101, enabling a customized application to use commands specific to SSD 101 even with a generic driver. ONA techniques include one or more of: use of non-standard modifiers (hints); use of vendor-specific commands; communication of non-standard statistics, such as actual NVM usage according to compressibility; and other techniques. DNA techniques include one or more of: use of non-standard commands or vendor-specific providing unmapped read, write, and/or erase access to the NVM; use of non-standard or vendor-specific commands providing more direct access to the NVM, such as by bypassing formatting of data that the I/O device would otherwise do; and other techniques. Examples of the driver are a driver without ONA or DNA support, an ONA-enabled driver, a DNA-enabled driver, and an ONA/DNA-enabled driver. Further examples of the driver are a vendor-provided, vendor-developed, and/or vendor-enhanced driver, and a client-provided, client-developed, and/or client-enhanced driver.

Examples of the application-level programs are an application without ONA or DNA support, an ONA-enabled application, a DNA-enabled application, and an ONA/DNA-enabled application. Dotted-arrow 109D is representative of application I/O device communication (e.g. bypass via a driver or bypass via a VF for an application), e.g. an ONA-enabled application and an ONA-enabled driver communicating with an SSD, such as without the application using the OS as an intermediary. Dotted-arrow 109V is representative of application I/O device communication (e.g. bypass via a VF for an application), e.g. a DNA-enabled application and a DNA-enabled driver communicating with an SSD, such as without the application using the OS or the driver as intermediaries.

Some of the embodiments that include switch/fabric/intermediate controller 103 also include card memory 112C coupled via memory interface 180 and accessible by the SSDs 101. In various embodiments, one or more of the SSDs 101, the switch/fabric/intermediate controller 103, and/or the card memory 112C are included on a physically identifiable module, card, or pluggable element (e.g., I/O Card 116). In some embodiments, SSD 101 (or variations thereof) corresponds to a SAS drive or a SATA drive that is coupled to an initiator operating as host system 102.

In some embodiments lacking the switch/fabric/intermediate controller, the SSD 101 is coupled to the host system 102 directly via external interfaces 110. In various embodiments, SSD Controller 100 is coupled to the host system 102 via one or more intermediate levels of other controllers, such as a RAID controller. In some embodiments, SSD 101 (or variations thereof) corresponds to a SAS drive or a SATA drive and switch/fabric/intermediate controller 103 corresponds to an expander that is in turn coupled to an initiator, or alternatively switch/fabric/intermediate controller 103 corresponds to a bridge that is indirectly coupled to an initiator via an expander. In some embodiments, switch/fabric/intermediate controller 103 includes one or more PCIe switches and/or fabrics.

In various embodiments, such as some of the embodiments where host system 102 is a computing host (e.g., a computer, a workstation computer, a server computer, a storage server, a SAN, a NAS device, a DAS device, a storage appliance, a PC, a laptop computer, a notebook computer, and/or a netbook computer), the computing host is optionally enabled to communicate (e.g., via optional I/O & Storage Devices/Resources 117 and optional LAN/WAN 119) with one or more local and/or remote servers (e.g., optional servers 118). The communication enables, for example, local and/or remote access, management, and/or usage of any one or more of SSD 101 elements. In some embodiments, the communication is wholly or partially via Ethernet. In some embodiments, the communication is wholly or partially via Fibre Channel. LAN/WAN 119 is representative, in various embodiments, of one or more Local and/or Wide Area Networks, such as any one or more of a network in a server farm, a network coupling server farms, a metro-area network, and the Internet.

In various embodiments, an SSD controller and/or a computing-host flash memory controller in combination with one or more NVMs are implemented as a non-volatile storage component, such as a USB storage component, a CF storage component, a MultiMediaCard (MMC) storage component, an eMMC storage component, a Thunderbolt storage component, a UFS storage component, an SD storage component, a memory stick storage component, and an xD-picture card storage component.

In various embodiments, all or any portions of an SSD controller (or a computing-host flash memory controller), or functions thereof, are implemented in a host that the controller is to be coupled with (e.g., host system 102). In various embodiments, all or any portions of an SSD controller (or a computing-host flash memory controller), or functions thereof, are implemented via hardware (e.g., logic circuitry), software and/or firmware (e.g., driver software or SSD control firmware), or any combination thereof.

Figure 4:
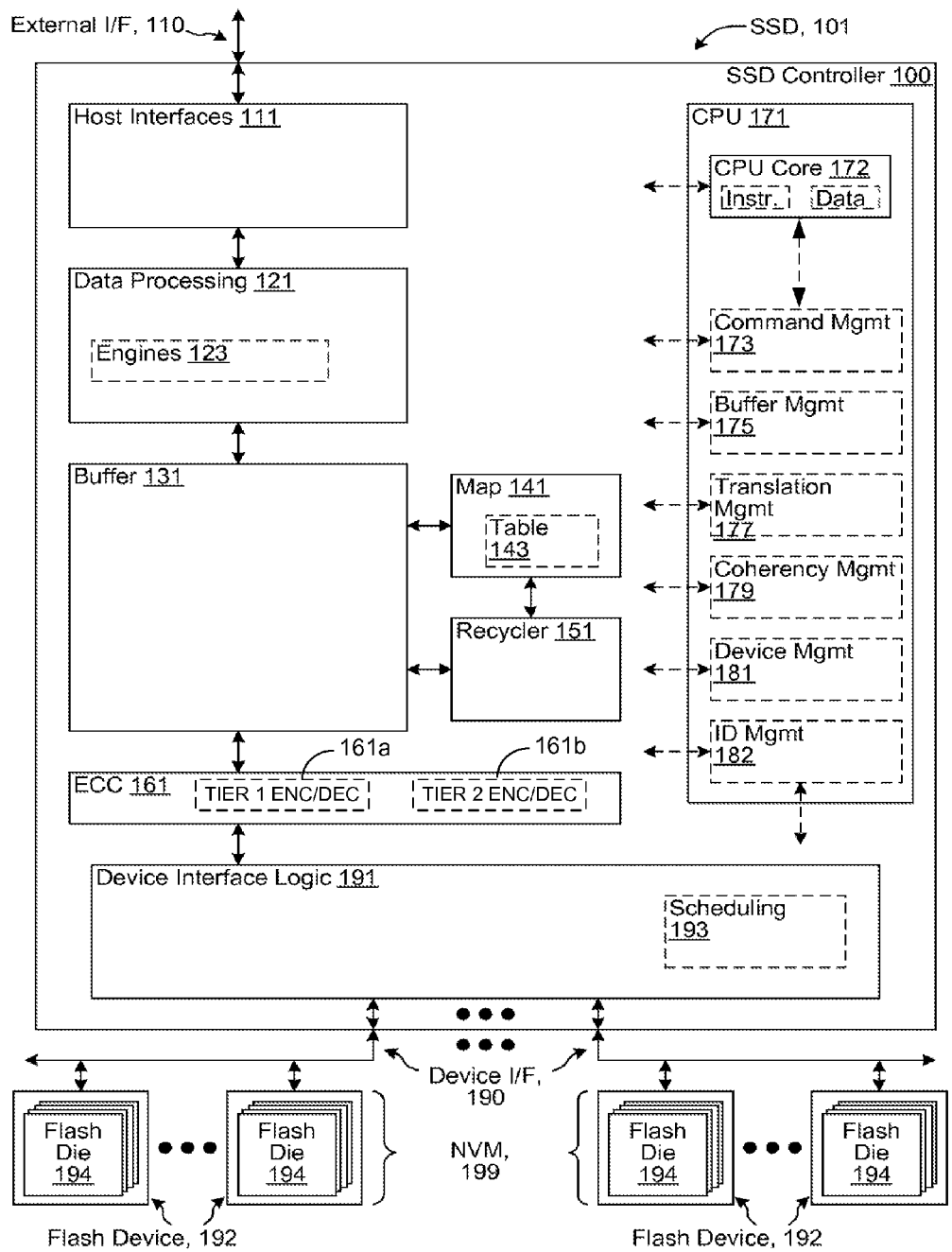
FIG. 4 illustrates a block diagram of an illustrative embodiment of one of the SSDs shown in FIG. 3 including the SSD controller shown in FIG. 3 that performs flash cell programming in a way that ensures that programming errors do not occur when programming the reference voltage ranges of the flash cells.

FIG. 4 illustrates a block diagram of an illustrative embodiment of one of the SSDs 101 shown in FIG. 3 including the SSD controller 100 shown in FIG. 3 that performs flash cell programming in a way that ensures that programming errors do not occur when programming the reference voltage ranges of the flash cells. Prior to describing an illustrative embodiment of the manner in which the SSD controller 100 performs flash cell programming, the configuration of the SSD controller 100 that is suitable for performing the methods will be described with reference to FIG. 4.

SSD controller 100 is communicatively coupled via one or more external interfaces 110 to the host system 102 (FIG. 3). According to various embodiments, external interfaces 110 are one or more of: a SATA interface; a SAS interface; a PCIe interface; a Fibre Channel interface; an ethernet interface (such as 10 Gigabit Ethernet); a non-standard version of any of the preceding interfaces; a custom interface; or any other type of interface used to interconnect storage and/or communications and/or computing devices. For example, in some embodiments, SSD controller 100 includes a SATA interface and a PCIe interface.

SSD controller 100 is further communicatively coupled via one or more device interfaces 190 to NVM 199, which includes one or more flash devices 192. According to various illustrative embodiments, device interfaces 190 are one or more of: an asynchronous interface; a synchronous interface; a single-data-rate (SDR) interface; a double-data-rate (DDR) interface; a DRAM-compatible DDR or DDR2 synchronous interface; an Open NAND Flash Interface (ONFI) compatible interface, such as an ONFI 2.2 or ONFI 3.0 compatible interface; a Toggle-mode compatible flash interface; a non-standard version of any of the preceding interfaces; a custom interface; or any other type of interface used to connect to storage devices.

Each flash device 192 includes one or more individual flash dies 194. According to type of a particular one of flash devices 192, a plurality of the flash dies 194 in the particular flash device 192 are optionally and/or selectively accessible in parallel. Flash device 192 is merely representative of one type of storage device enabled to communicatively couple to SSD controller 100. In various embodiments, any type of storage device is usable, such as an SLC NAND flash memory, MLC NAND flash memory, NOR flash memory, flash memory using polysilicon or silicon nitride technology-based charge storage cells, two- or three-dimensional technology-based flash memory, read-only memory, static random access memory, dynamic random access memory, ferromagnetic memory, phase-change memory, racetrack memory, ReRAM, or any other type of memory device or storage medium.

According to various embodiments, device interfaces 190 are organized as: one or more busses with one or more of flash device 192 per bus; one or more groups of busses with one or more of flash device 192 per bus, where busses in a group are generally accessed in parallel; or any other organization of one or more of flash device 192 onto device interfaces 190.

The SSD controller 100 typically, but not necessarily, has one or more modules, such as, for example, host interfaces module 111, data processing module 121, buffer module 131, map module 141, recycler module 151, ECC module 161, device interface logic module 191, and CPU 171. The specific modules and interconnections illustrated in FIG. 4 are merely representative of one embodiment, and many arrangements and interconnections of some or all of the modules, as well as additional modules not illustrated, are possible, and fewer than all of the modules shown in FIG. 4 may be included in the SSD controller 100. In a first example, in some embodiments, there are two or more host interfaces 111 to provide dual-porting. In a second example, in some embodiments, data processing module 121 and/or ECC module 161 are combined with buffer module 131. In a third example, in some embodiments, host interfaces module 111 is directly coupled to buffer module 131, and data processing module 121 optionally and/or selectively operates on data stored in buffer module 131. In a fourth example, in some embodiments, device interface logic module 191 is directly coupled to buffer module 131, and ECC module 161 optionally and/or selectively operates on data stored in buffer module 131.

Host interfaces module 111 sends and receives commands and/or data via external interfaces 110. For example, the commands include a read command specifying an address (such as a logical block address (LBA)) and an amount of data (such as a number of LBA quanta, e.g., sectors) to read; in response the SSD 101 provides read status and/or read data. As another example, the commands include a write command specifying an address (such as an LBA) and an amount of data (such as a number of LBA quanta, e.g., sectors) to write; in response the SSD 101 provides write status and/or requests write data and optionally subsequently provides write status. For yet another example, the commands include a de-allocation command (e.g., a trim command) specifying one or more addresses (such as one or more LBAs) that no longer need be allocated.

According to various embodiments, one or more of: Data processing module 121 optionally and/or selectively processes some or all data sent between buffer module 131 and external interfaces 110; and data processing module 121 optionally and/or selectively processes data stored in buffer module 131. In some embodiments, data processing module 121 uses one or more engines 123 to perform one or more of: formatting; reformatting; transcoding; and any other data processing and/or manipulation task.

Buffer module 131, which is optional, stores data sent to/from external interfaces 110 from/to device interfaces 190. In some embodiments, buffer module 131 additionally stores system data, such as some or all map tables, used by SSD controller 100 to manage one or more of the flash devices 192. Buffer module 131 is typically a portion of the local memory of the SSD controller 100 that has been allocated for use as temporary storage for storing MSB and LSB page data to be written to flash memory cells of the flash die 194. The buffer module 131 typically, but not necessarily, also includes a direct memory access (DMA) engine (not shown) that is used to control movement of data to and/or from the buffer module 131 and ECC-X engine (not shown) that is used to provide higher-level error correction and/or redundancy functions.

ECC module 161 processes some or all data sent between buffer module 131 and device interfaces 190. ECC module 161 optionally and/or selectively processes data stored in buffer module 131. In some embodiments, ECC module 161 is used to provide lower-level error correction and/or redundancy functions in accordance with one or more ECC techniques. In some embodiments, ECC module 161 implements one or more of: a CRC code; a Hamming code; an RS code; a BCH code; an LDPC code; a Viterbi code; a trellis code; a hard-decision code; a soft-decision code; an erasure-based code; any error detecting and/or correcting code; and any combination of the preceding.

ECC module 161 includes one or more ECC encoders for performing ECC encoding and one or more ECC decoders for performing ECC decoding. In accordance with an illustrative embodiment, the ECC module 161 includes two tiers of encoding/decoding logic, namely, a tier 1 encoding/decoder 161a and a tier 2 encoder/decoder 161b. The tier 1 encoder/decoder 161a performs a stronger, or more robust, level of ECC encoding/decoding than the level of ECC encoding/decoding performed by the tier 2 encoding/decoding logic 161b. For example, the tier 1 encoder/decoder 161a may use LDPC codes whereas the tier 2 encoder/decoder 161b may use BCH codes. The tier 1 encoding/decoding is typically soft-decision ECC encoding/decoding, whereas the tier 2 encoding/decoding is typically a hard-decision ECC encoding/decoding. The reasons for using these different levels of ECC encoding/decoding is described below in detail. The invention is not limited with respect to the types of soft- and hard-decision ECC encoding/decoding techniques that are used as the tier 1 and tier 2 ECC encoding/decoding techniques, respectively. As will be understood by those of skill in the art in view of the description being provided herein, a variety of soft- and hard-decision ECC encoding/decoding techniques are suitable for use with the invention as the tier 1 and tier 2 ECC encoding/decoding techniques, respectively. Because such techniques are well known in the art, they will not be described herein in detail.

Device interface logic module 191 controls instances of flash device 192 via device interfaces 190. Device interface logic module 191 is enabled to send data to/from the instances of flash device 192 according to a protocol of flash device 192. Device interface logic module 191 typically includes scheduling logic 193 that selectively sequence controls instances of flash device 192 via device interfaces 190. For example, in some embodiments, scheduling logic 193 is enabled to queue operations to the instances of flash device 192, and to selectively send the operations to individual ones of the instances of flash device 192 (or flash die 194) as individual ones of the instances of flash device 192 (or flash die 194) become available.

Map module 141 converts between data addressing used on external interfaces 110 and data addressing used on device interfaces 190, using table 143 to map external data addresses to locations in NVM 199. For example, in some embodiments, map module 141 converts LBAs used on external interfaces 110 to block and/or page addresses targeting one or more flash die 194, via mapping provided by table 143. In some embodiments, map module 141 uses table 143 to perform and/or to look up translations between addresses used on external interfaces 110 and data addressing used on device interfaces 190. According to various embodiments, table 143 is one or more of: a one-level map; a two-level map; a multi-level map; a map cache; a compressed map; any type of mapping from one address space to another; and any combination of the foregoing. According to various embodiments, table 143 includes one or more of: static random access memory; dynamic random access memory; NVM (such as flash memory); cache memory; on-chip memory; off-chip memory; and any combination of the foregoing.

In some embodiments, recycler module 151 performs garbage collection. For example, in some embodiments, instances of flash device 192 contain blocks that must be erased before the blocks are re-writeable. Recycler module 151 is enabled to determine which portions of the instances of flash device 192 are actively in use (e.g., allocated instead of de-allocated), such as by scanning a map maintained by map module 141, and to make unused (e.g., de-allocated) portions of the instances of flash device 192 available for writing by erasing them. In further embodiments, recycler module 151 is enabled to move data stored within instances of flash device 192 to make larger contiguous portions of the instances of flash device 192 available for writing.

In some embodiments, instances of flash device 192 are selectively and/or dynamically configured, managed, and/or used to have one or more bands for storing data of different types and/or properties. A number, arrangement, size, and type of the bands are dynamically changeable. For example, data from a computing host is written into a hot (active) band, while data from recycler module 151 is written into a cold (less active) band. In some usage scenarios, if the computing host writes a long, sequential stream, then a size of the hot band grows, whereas if the computing host does random writes or few writes, then a size of the cold band grows.

CPU 171 controls various portions of SSD controller 100. CPU module 171 typically includes CPU Core 172, which is, according to various embodiments, one or more single-core or multi-core processors. The individual processor cores in CPU core 172 are, in some embodiments, multi-threaded. CPU core 172 includes instruction and/or data caches and/or memories. For example, the instruction memory contains instructions to enable CPU core 172 to execute programs (e.g. software sometimes called firmware) to control SSD Controller 100. In some embodiments, some or all of the firmware executed by CPU core 172 is stored on instances of flash device 192.

In various embodiments, CPU 171 further includes: command management logic 173 for tracking and controlling commands received via external interfaces 110 while the commands are in progress; buffer management logic 175 for controlling allocation and use of buffer module 131; translation Management logic 177 for controlling map module 141; coherency management module 179 for controlling consistency of data addressing and for avoiding conflicts such as between external data accesses and recycle data accesses; device management logic 181 for controlling device interface logic 191; identity management logic 182 for controlling modification and communication of identity information, and optionally other management units. None, any, or all of the management functions performed by CPU 171 are, according to various embodiments, controlled and/or managed by hardware, by software (such as firmware executing on CPU core 172 or on host system 102 (FIG. 3) connected via external interfaces 110), or any combination thereof.

In various embodiments, all or any portions of an SSD Controller 100 are implemented on a single IC, a single die of a multi-die IC, a plurality of dice of a multi-die IC, or a plurality of ICs. For example, buffer module 131 may be implemented on a same die as other elements of SSD controller 100. As another example, buffer module 131 may be implemented on a different die than other elements of SSD controller 100. The SSD controller 100 and one or more of the flash devices 192 may be implemented on the same die, although they are typically implemented on separate dies.

As described above in the Background of the Invention, flash memory is typically programmed in two stages, namely, a first stage during which LSB page programming is performed and a second stage during which MSB page programming is performed. As also described above, during the second stage, errors in the LSB page data read out of the flash cells will typically cause the target reference voltage ranges to be incorrectly determined, and therefore mis-programmed. Because the time interval between LSB page programming and MSB page programming is typically short, the LSB page data does not contain retention errors, but may contain errors caused by other factors (i.e., program, erase and/or read errors). However, such errors can be easily corrected by using known hard-decision (i.e., relatively weak) ECC decoding techniques, which can be relatively easily and inexpensively implemented on a flash die 194. Because the SSD controller 100 should be capable of handling all types of errors (i.e., retention, program, erase and/or read errors), soft-decision (i.e., relatively strong) ECC encoding/decoding techniques are implemented in the SSD controller 100 by the ECC module 161 for all data that is written to and read from the flash dies 194, as will be described below in detail.

In accordance with an illustrative embodiment, tier 2 ECC decoding logic is implemented on the flash die. During the MSB page data programming stage, the associated LSB page data is read from the flash cells and is error corrected by the tier 2 ECC decoding logic of the flash die. The error-corrected LSB page data is then used in conjunction with the MSB page data in the known manner to determine the proper reference voltage ranges to be programmed for the flash cells. The manner in which the MSB page data programming stage has been altered to perform the ECC decoding process on the flash die 194 to ensure that the LSB data that is used in determining the reference voltage values does not contain errors will now be described with reference to FIGS. 3-9.

Figure 5:
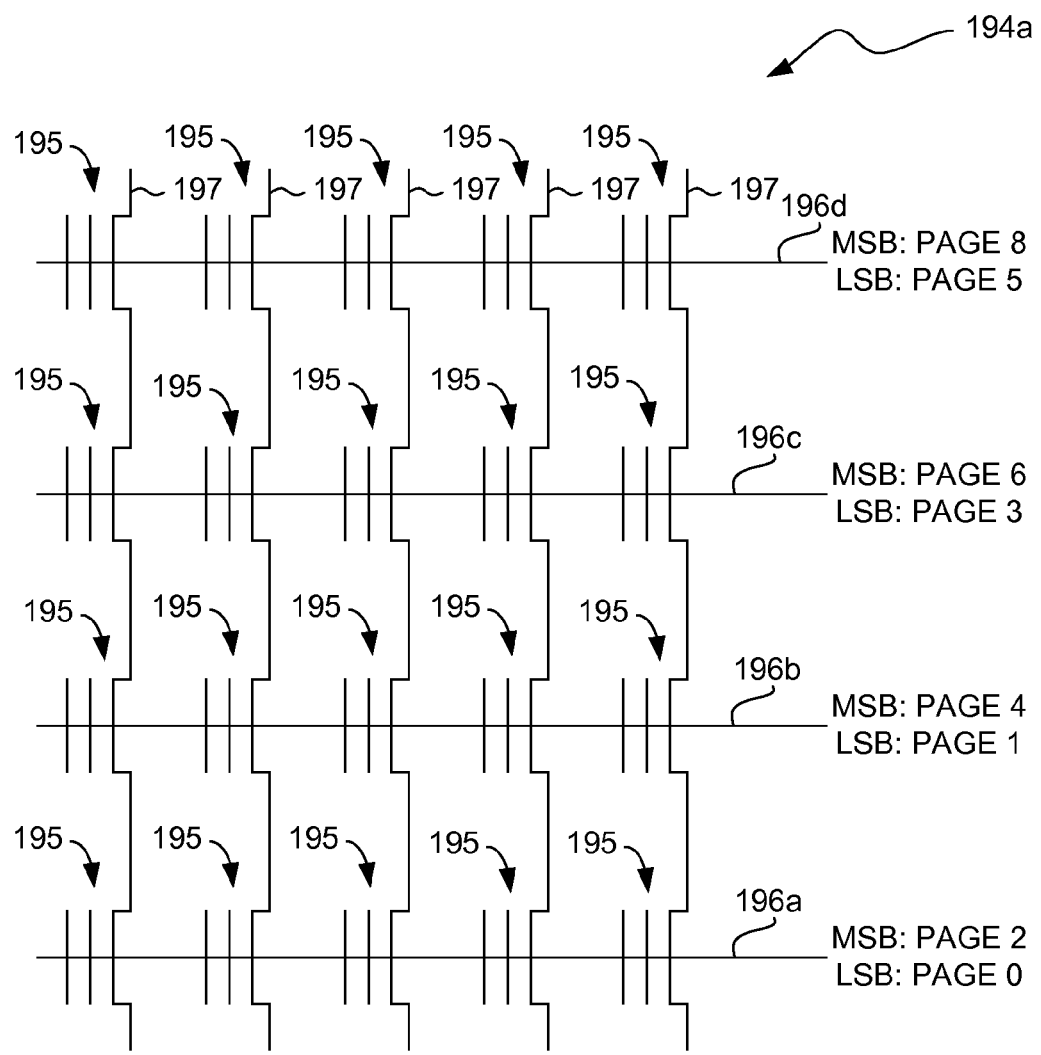
FIG. 5 illustrates a block diagram of a plurality of flash cells disposed in a portion of one of the flash dies shown in FIG. 4.

FIG. 5 illustrates a block diagram of a plurality of flash cells 195 disposed in a portion 194a of one of the flash dies 194 shown in FIG. 4. A plurality of word lines 196a-196d and bit lines 197 are used to address LSB and MSB pages of the flash cells 195 (FIG. 5). An example of the manner in which the LSB and MSB pages are programmed is provided below in conjunction with a description of the manner in which the MSB page data programming stage has been altered to perform the ECC decoding process on the flash die 194.

Figure 6:
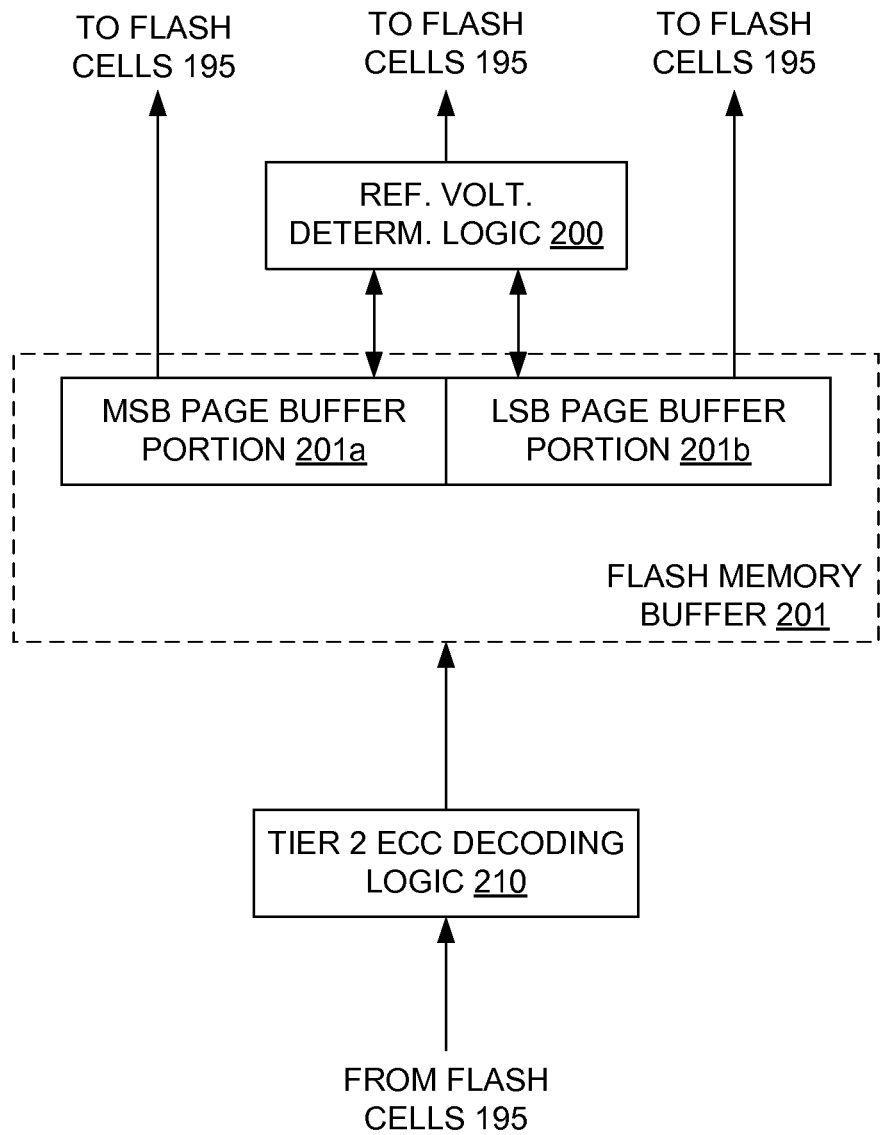
FIG. 6 illustrates a block diagram of a portion of one of the flash dies shown in FIG. 4 that includes reference voltage range determination logic, a flash memory buffer and tier 2 ECC decoding logic.

FIG. 6 illustrates a block diagram of a portion of one of the flash dies 194 that includes reference voltage determination logic 200 for determining the reference voltage ranges for the flash cells 195, a flash memory buffer 201 for holding MSB data and LSB data to be written to the flash cells 195, and tier 2 ECC decoding logic 210 for performing tier 2 decoding of LSB page data to be used in determining the reference voltage ranges for the flash cells 195. The logic 200 and 210 are typically state machines, but could be some other type of logic, such as one or more processors, for example. The invention is not limited with respect to the manner in which the logic 200 and 210 are implemented in the flash die 194. The manner in which the reference voltage determination logic 200, the flash memory buffer 201 and the tier 2 ECC decoding logic 210 operate is described below in conjunction with a description of the manner in which the MSB page data programming stage has been altered to perform the ECC decoding process on the flash die 194.

Figure 7A:
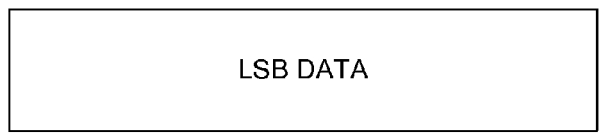
FIGS. 7A-7C illustrate an LSB page data frame before and after being concatenated with tier 1 and tier 2 parity bits.
Figure 7B:
Figure 7C:
Figure 8A:
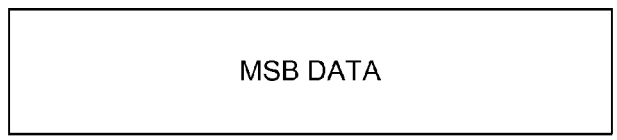
FIGS. 8A-8C illustrate an MSB page data frame before and after being concatenated with tier 1 parity bits and other data bits.
Figure 8B:
Figure 8C:

FIGS. 7A-7C illustrate LSB data frames before and after being concatenated with tier 1 and tier 2 parity bits. FIGS. 8A-8C illustrate LSB data frames before and after being concatenated with tier 1 parity bits and other data. An example of the manner in which the data is encoded/decoded is described below in conjunction with a description of the manner in which the MSB page data programming stage has been altered to perform the ECC decoding process on the flash die 194.

In accordance with an illustrative embodiment, the following process occurs when writing data to the flash die 194: (1) MSB and LSB page data to be written to flash memory is received in the SSD controller 100 (FIG. 3) from the host system 102 (FIG. 3). For exemplary purposes, it will be assumed that the SSD controller 100 temporarily places the LSB page data in buffer 131 (FIG. 4), although the buffer 131 and the buffering step are optional because some SSD controllers do not include such buffers. The MSB and LSB page data to be written is loaded into the buffer 131 (FIG. 4) of the SSD controller 100; (2) the LSB page data (FIG. 7A) held in the buffer 131 (FIG. 4) is subjected to tier 1 (i.e., relatively strong) ECC encoding (FIG. 7B); (3) the tier 1-encoded LSB page data (FIG. 7B) is then subjected to tier 2 (i.e., relatively weak) ECC encoding (FIG. 7C); (4) the tier 1/tier 2-encoded LSB page data (FIG. 7C) is sent to the flash die 194 (FIG. 4), which loads it into the LSB page buffer portion 201b (FIG. 6) of the flash memory buffer 201; (5) the tier 1/tier 2-encoded LSB page data contained in the LSB page buffer portion 201b (FIG. 6) is written, or programmed, to the corresponding LSB page of the flash cells 195 (FIG. 5); (6) the MSB page data (FIG. 8A) contained in the buffer 131 (FIG. 4) is subjected to tier 1 ECC encoding; (7) the tier 1-encoded MSB page data (FIG. 8B), with other data bits concatenated to it (FIG. 8C) to make it the same size as the concatenated LSB frame shown in FIG. 7C, is then sent to the flash die 194, which loads the tier 1-encoded MSB page data into the MSB page buffer portion 201a (FIG. 6); (8) the tier 1/tier 2-encoded LSB page data is read from the LSB page of flash memory cells 195 (FIG. 5) and sent to tier 2 ECC decoding logic 210 (FIG. 6) of the flash die 194; (9) the tier 2 ECC decoding logic 210 (FIG. 6) of the flash die 194 (FIGS. 4 and 5) performs tier 2 ECC decoding to produce an error-corrected tier 1-encoded LSB page data and loads the error-corrected tier 1-encoded LSB page data into the LSB page buffer portion 201b; (10) the error-corrected tier 1-encoded LSB page data and the tier 1-encoded MSB page data contained in the LSB page buffer 201b and the MSB page buffer portion 201a, respectively, are used by the reference voltage determination logic 200 (FIG. 6) of the flash die 194 to determine the proper reference voltage ranges for the corresponding flash cells 195 (FIG. 5) of the die 194; and (11) the reference voltage determination logic 200 (FIG. 6) programs the corresponding flash cells 195 (FIG. 5) to the proper reference voltage ranges.

An example of the manner in which steps (1)-(11) are performed during LSB and MSB page programming in accordance with an illustrative embodiment will now be described. The SSD controller 100 receives data to be written to the NVM 199 from the host system 102. For example purposes, it will be assumed that eight pages (LSB pages 0, 1, 3, and 5 and MSB pages 2, 4, 6, and 8) of data are to be written to the flash die portion 194a (FIG. 5). The eight pages of data are received in the SSD controller 100 from the host system 102. The invention is not limited with respect to the size of the data frames that are transferred from the host system 102 to the SSD controller 100. It will also be assumed that the data is temporarily stored in the buffer 131, although the buffer 131 and the buffering step are optional.

The SSD controller 100 loads LSB page 0, LSB page 1, MSB page 2 and MSB page 4 data into buffer 131. The ECC module 161 uses the tier 1 encoder/decoder 161a and the tier 2 encoded/decoder 161b to perform tier 1 and tier 2 ECC encoding, respectively, on the LSB page 0 data such that the LSB page 0 data has the configuration shown in FIG. 7C. The SSD controller 100 sends the tier 1/tier 2-encoded LSB page 0 data to the flash die 194, which loads the LSB page 0 data into the LSB page buffer portion 201b (FIG. 6) of flash die 194. In a typical configuration of the flash die 194, the MSB and LSB page buffer portions 201a and 201b (FIG. 6), respectively, each have a capacity for holding a single page of MSB and LSB data, respectively, although the invention is not limited with respect to the storage capacity of buffer portions 201a and 201b. Logic (not shown) inside of the flash die 194 then writes the tier 1/tier 2-encoded LSB page 0 data held in LSB page buffer portion 201b to the corresponding flash cells 195 (FIG. 5) connected to word line 196a (FIG. 5).

The ECC module 161 uses the tier 1 encoder/decoder 161a and the tier 2 encoded/decoder 161b to perform tier 1 and tier 2 ECC encoding, respectively, on the LSB page 1 data such that the LSB page 1 data has the configuration shown in FIG. 7C. The SSD controller 100 sends the tier 1/tier 2-encoded LSB page 1 data to the flash die 194, which loads the LSB page 1 data into the LSB page buffer portion 201b (FIG. 6) of flash die 194, thereby overwriting the LSB page 0 data. Logic (not shown) inside of the flash die 194 then writes the LSB page 1 data to corresponding flash cells 195 connected to word line 196b (FIG. 5).

Figure 2:
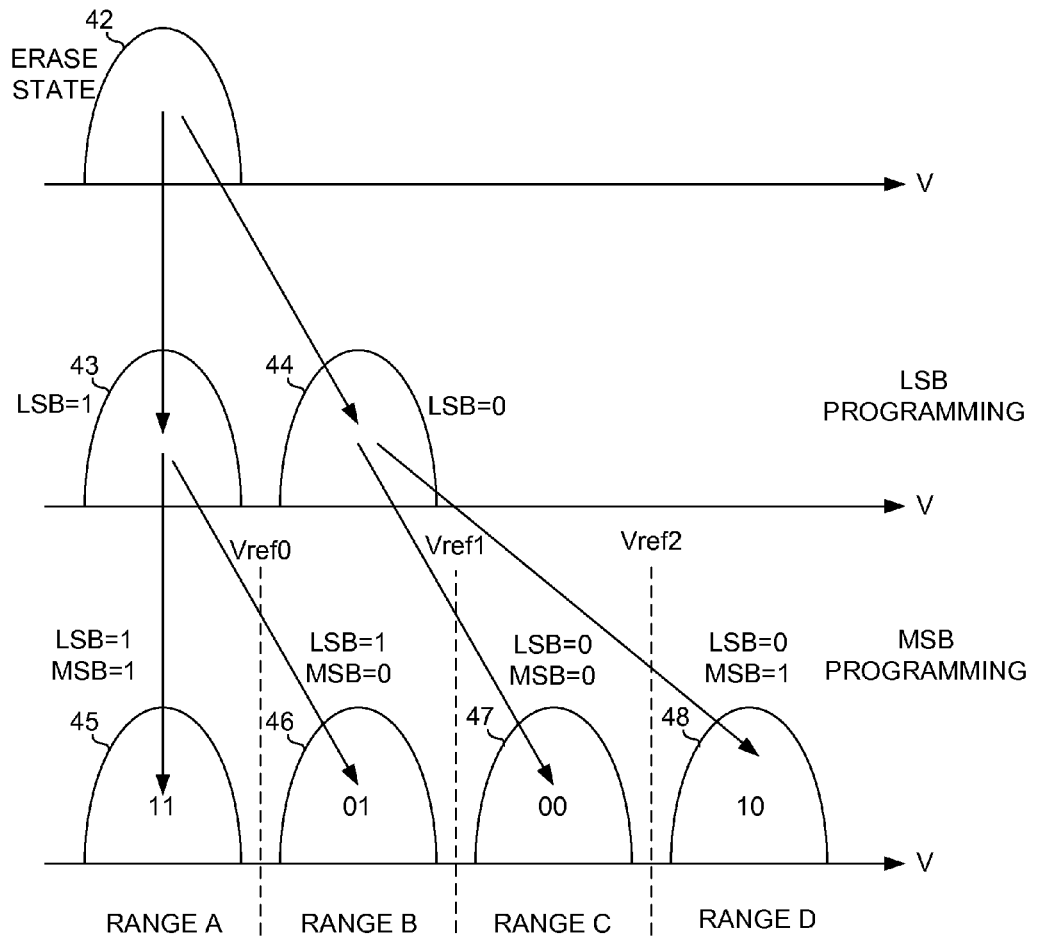
FIG. 2 is a plot of cell voltage distributions in a flash memory device, as known in the art, and demonstrates the manner in which LSB and MSB value pairs are used to determine the reference voltage ranges.

The ECC module 161 (FIG. 4) uses the tier 1 encoder/decoder 161a to perform tier 1 ECC encoding on the MSB page 2 data such that the MSB page 2 data has the configuration shown in FIG. 8B. Additional data bits are added to the MSB page 2 data such that it has the configuration shown in FIG. 8C. The SSD controller 100 sends the tier 1-encoded MSB page 2 data to the flash die 194, which loads the tier-1-encoded MSB page 2 data into the MSB page buffer portion 201a (FIG. 6) of flash die 194. The tier 2 decoding logic 210 reads the tier 1/tier 2-encoded LSB page 0 data from the LSB page of flash cells 195 (FIG. 5), performs tier 2 ECC decoding on the LSB page 0 data to produce error-corrected tier 1-encoded LSB page 0 data, and loads the error-corrected tier 1-encoded LSB page 0 data into the LSB page buffer portion 201b (FIG. 6). The reference voltage determination logic 200 (FIG. 6) then uses the tier 1-encoded MSB page 2 data and the error-corrected tier 1-encoded LSB page 0 data contained in the MSB and LSB page buffer portions 201a and 201b, respectively, to determine the proper reference voltage ranges to be programmed for the flash cells 195 connected to word line 196a (FIG. 5). Because the manner in which the LSB and MSB data pair is used to determine the proper reference voltage ranges has been described above with reference to FIG. 2, it will not be described again herein in the interest of brevity.

The ECC module 161 (FIG. 4) uses the tier 1 encoder/decoder 161a to perform tier 1 ECC encoding on the MSB page 4 data. The SSD controller 100 then sends the tier 1-encoded MSB page 4 data (FIG. 8C) to the flash die 194, which loads the encoded MSB page 4 data into the MSB page buffer portion 201a (FIG. 6). The tier 2 decoding logic 210 reads the tier 1/tier 2-encoded LSB page 1 data from the LSB page of flash cells 195 (FIG. 5), performs tier 2 ECC decoding on the LSB page 1 data to correct errors in the LSB page 1 data, and loads the error-corrected LSB page 1 data into the LSB page buffer portion 201b (FIG. 6). The reference voltage determination logic 200 (FIG. 6) then uses the error-corrected tier 1-encoded LSB page 1 data and the tier 1-encoded MSB page 4 data contained in the LSB and MSB page buffer portions 201b and 201a, respectively, (FIG. 6) to determine the proper reference voltage ranges to be programmed for the flash cells 195 connected to word line 196b (FIG. 5).

The SSD controller 100 loads LSB pages 3 and 5 and MSB pages 6 and 8 into buffer 131 (FIG. 4). The ECC module 161 (FIG. 4) uses the tier 1 encoder/decoder 161a and the tier 2 encoded/decoder 161b to perform tier 1 and tier 2 ECC encoding, respectively, on the LSB page 3 data and sends the tier 1/tier 2-encoded LSB page 3 data to the flash die 194, which loads the LSB page 3 data into the LSB page buffer portion 201b (FIG. 6) of flash die 194. Logic (not shown) inside of the flash die 194 then writes the tier 1/tier 2-encoded LSB page 3 data held in LSB page buffer portion 201b (FIG. 6) to the corresponding flash cells 195 (FIG. 5) connected to word line 196c (FIG. 5).

The ECC module 161 uses the tier 1 encoder/decoder 161a and the tier 2 encoded/decoder 161b to perform tier 1 and tier 2 ECC encoding, respectively, on the LSB page 5 data and sends the tier 1/tier 2-encoded LSB page 5 data to the flash die 194, which loads the LSB page 5 data into the LSB page buffer portion 201b (FIG. 6) of flash die 194, thereby overwriting the LSB page 3 data. Logic (not shown) inside of the flash die 194 then writes the LSB page 5 data to corresponding flash cells 195 connected to word line 196d (FIG. 5).

The ECC module 161 uses the tier 1 encoder/decoder 161a to perform tier 1 ECC encoding on the MSB page 6 data. The SSD controller 100 sends the tier 1-encoded MSB page 6 data to the flash die 194, which loads the MSB page 6 data into the MSB page buffer portion 201*a* (FIG. 6) of flash die 194. The tier 2 decoding logic 210 reads the tier 1/tier 2-encoded LSB page 3 data from the LSB page of flash cells 195 (FIG. 5), performs tier 2 ECC decoding on the LSB page 3 data to correct errors in the LSB page 3 data, and loads the error-corrected tier 1-encoded LSB page 3 data into the LSB page buffer portion 201*b* (FIG. 6). The reference voltage determination logic 200 (FIG. 6) then uses the tier 1-encoded MSB page 6 data and the error-corrected tier 1-encoded LSB page 3 data contained in the MSB and LSB page buffer portions 201*a* and 201*b*, respectively, to determine the proper reference voltage ranges to be programmed for the flash cells 195 connected to word line 196*c* (FIG. 5).

The ECC module 161 uses the tier 1 encoder/decoder 161*a* to perform tier 1 ECC encoding on the MSB page 8 data and sends the tier 1-encoded MSB page 8 data to the flash die 194. Logic inside of the flash die 194 loads the tier 1-encoded MSB page 8 data into the MSB page buffer portion 201*a* (FIG. 6). The tier 2 decoding logic 210 reads the tier 1/tier 2-encoded LSB page 5 data from the corresponding LSB page of flash cells 195 (FIG. 5), performs tier 2 ECC decoding on the LSB page 5 data to correct errors in the LSB page 5 data, and loads the error-corrected tier 1-encoded LSB page 5 data into the LSB page buffer portion 201*b* (FIG. 6). The reference voltage determination logic 200 (FIG. 6) then uses the error-corrected tier 1-encoded LSB page 5 data and the MSB page 8 data contained in the LSB and MSB page buffer portions 201*b* and 201*a*, respectively, (FIG. 6) to determine the proper reference voltage ranges to be programmed for the flash cells 195 connected to word line 196*d* (FIG. 5).

It should be noted that the invention is not limited with respect to the order in which data is transferred from the host system 102 to the SSD controller 100, ECC encoded in the SSD controller 100, transferred from the SSD controller 100 to the flash die 194, written to the flash cells 195, read from the flash cells 195, decoded by the tier 2 ECC decoding logic 210, loaded into and unloaded from the buffer portions 201*a* and 201*b*, loaded into the reference voltage determination logic 200, transferred from the flash die 195 to the SSD controller 100, ECC decoded in the SSD controller 100, and transferred from the SSD controller 100 to the host system 102. The above example assumes that LSB pages and MSB pages are programmed in a particular order, but the invention is not limited to the LSB and MSB pages being programmed in any particular order, as will be understood by those of skill in the art in view of the description being provided herein.

Figure 9:
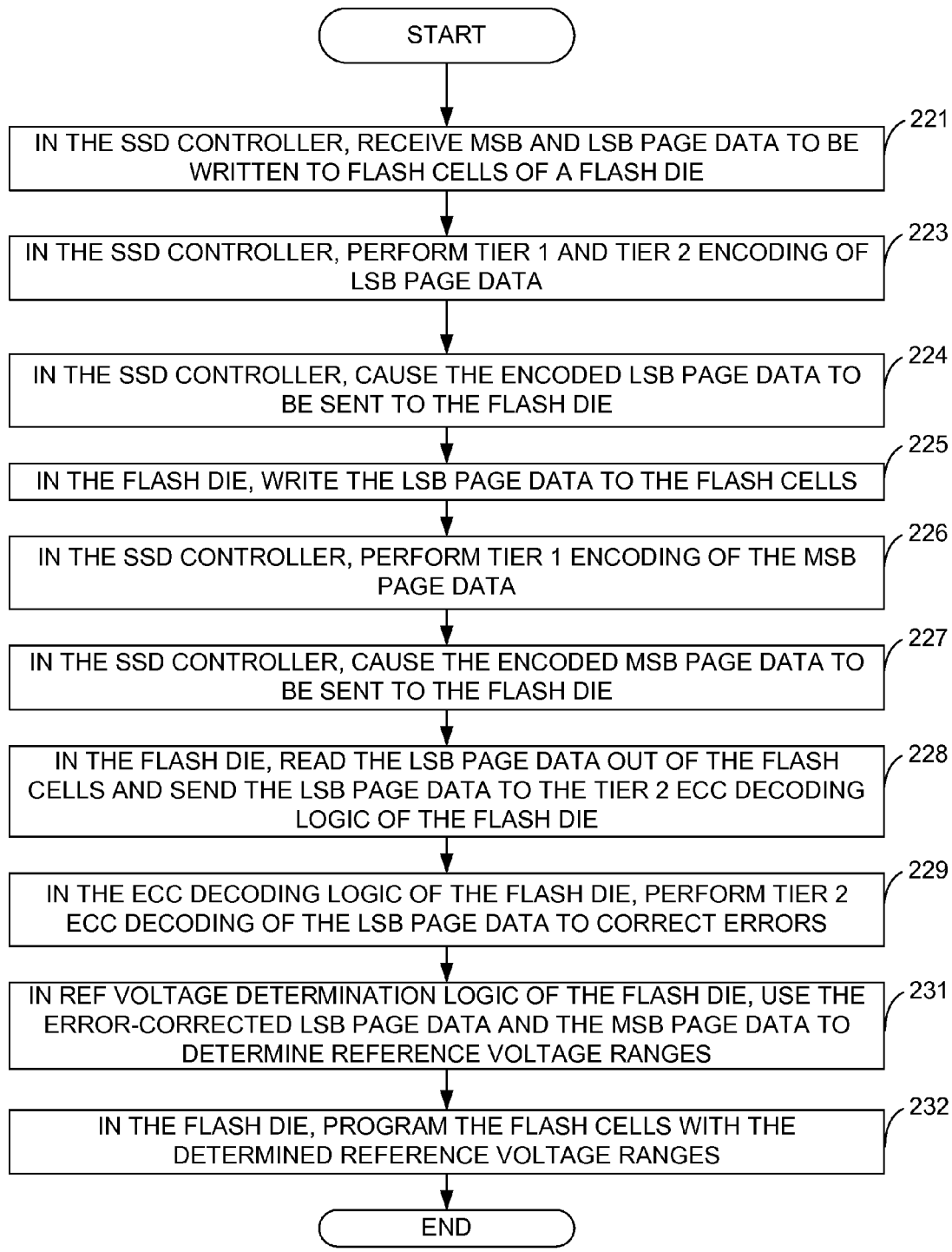
FIG. 9 illustrates a flow diagram that represents the method in accordance with an illustrative embodiment for preventing errors from occurring when determining reference voltage ranges for flash memory cells of a flash die.

FIG. 9 illustrates a flow diagram that represents the method in accordance with an illustrative embodiment for preventing errors from occurring when programming the reference voltage ranges. Data to be written to flash memory is received in the SSD controller 100 from the host system 102, as indicated by block 221. Tier 1 and tier 2 ECC encoding is then performed on the LSB page data, as indicated by block 223. The tier 1/tier 2-encoded LSB page data is then sent to the flash die 194, as indicated by block 224. In the flash die 194, the tier 1/tier 2-encoded LSB page data is written to the flash cells, as indicated by block 225.

In the SSD controller 100, tier 1 encoding is then performed in the MSB page data, as indicated by block 226. The SSD controller 100 then sends the tier 1-encoded MSB page data to the flash die 194, as indicated by block 227. In the flash die 194, the previously-written LSB page data is read from the flash cells and sent to the tier 2 ECC decoding logic 210 of the flash die 194, as indicated by block 228. The tier 2 ECC decoding logic 210 then performs tier 2 decoding on the LSB page data to correct errors in the LSB page data, as indicated by block 229. The error-corrected LSB page data and the MSB page data are then used by the reference voltage determination logic 200 to determine the proper reference voltage ranges for the flash cells 195, as indicated by block 231. The flash cells 195 are then programmed with the determined reference voltage ranges, as indicated by block 232.

It should be noted that the tier 2 ECC decoding process performed by logic 210 is only performed when data is being written to the flash cells 195. During a normal read operation, the LSB and MSB page data are transferred from the flash die 194 to the SSD controller 100 without any ECC decoding being performed in the flash die 194. In the case of a normal LSB page read operation, the tier 2 parity bits that were concatenated onto the LSB page data in the ECC module 161 are discarded from the LSB page read data. The ECC module 161 performs tier 1 (161*a*) ECC decoding on the LSB page read data to correct errors in the LSB page data. In the case of a normal MSB page read operation, when the MSB page read data is received in the SSD controller 100, the ECC module 161 performs tier 1 ECC (161*a*) decoding on the MSB page data to correct errors in the MSB page data. Thus, the MSB page read operation is performed in the known manner, whereas the LSB page read operation includes the additional operation of discarding the tier 2 parity bits before performing the tier 1 decoding operation. The tier 2 parity bits may be discarded in the flash die 194, in the SSD controller 100 or at any location in between the flash die 194 and the SSD controller 100.

It should be understood that the flow diagram of FIG. 9 is intended only to be exemplary or illustrative of the above-described method. In view of the descriptions herein, persons skilled in the art readily will be capable of programming or configuring an SSD controller or similar system in any of various ways to effectuate the above-described method and similar methods. The process represented by the blocks described above with regard to FIG. 9 is intended only as an example, and in other embodiments the steps or acts described above and similar steps or acts can occur in any other suitable order or sequence. Steps or acts described above can be combined with others or omitted in some embodiments. Similarly, the logic elements or components described above with regard to FIGS. 3-6 are intended only as examples of suitable configurations for performing the above-described method. Also, it should be understood that the combination of software instructions or similar logic and the memory in which such software instructions or similar logic is stored or embodied in non-transitory form comprise a "computer-readable medium" or "computer program product" as that term is used in the patent lexicon.

It should be noted that the invention has been described with reference to one or more exemplary embodiments for the purpose of demonstrating the principles and concepts of the invention. The invention is not limited to these embodiments. For example, although the above-described exemplary embodiment relates to MLC NAND flash memory, other embodiments can relate to TLC or any other suitable type of flash memory. As will be understood by persons skilled in the art, in view of the description provided herein, many variations may be made to the embodiments described herein and all such variations are within the scope of the invention.

What is claimed is:

1. A data storage system comprising:
a host system; and
a solid state drive (SSD) interfaced with the host system, the SSD including an SSD controller and at least one nonvolatile memory (NVM), the SSD controller including at least one SSD processor, a tier 1 error-correcting code (ECC) encoder/decoder, and a tier 2 ECC encoder/ decoder, wherein the NVM includes at least a first flash memory having a plurality of flash memory cells, reference voltage range determination logic and tier 2 ECC decoding logic, the SSD controller receiving write data from the host system to be programmed into flash cells of the NVM, the write data comprising at least a first most significant bit (MSB) page of data and at least a first least significant bit (LSB) page of data, the tier 1 ECC encoder/decoder performing tier 1 ECC encoding of the first LSB page of data to produce a tier 1-encoded first LSB page of data, the tier 2 ECC encoder/decoder performing tier 2 ECC encoding of the tier 1-encoded first LSB page of data to produce a tier 1/tier 2-encoded first LSB page data, the SSD controller sending the tier 1/tier 2-encoded first LSB page of data to the first flash memory, the tier 1 ECC encoding/decoding logic performing tier 1 ECC encoding of the first MSB page of data to produce a tier 1-encoded first MSB page of data, the SSD controller sending the tier 1-encoded first MSB page of data to the first flash memory, the tier 1 ECC encoding and the tier 2 encoding being different types of encoding, the tier 2 decoding logic of the first flash memory being adapted to perform tier 2 decoding of LSB page data in the first flash memory.

2. The data storage system of claim 1, wherein the first flash memory receives the tier 1/tier 2-encoded first LSB page of data and writes the tier 1/tier 2-encoded first LSB page of data to a first LSB page of the flash memory cells, and wherein the first flash memory receives the tier 1-encoded first MSB page of data, the first flash memory reading the tier 1/tier 2-encoded first LSB page of data from the first LSB page of the flash memory cells and sending the read tier 1/tier 2-encoded first LSB page to the tier 2 ECC decoding logic of the first flash memory, the tier 2 ECC decoding logic performing tier 2 ECC decoding on the tier 1/tier 2-encoded first LSB page of data to produce an error-corrected tier 1-encoded first LSB page of data, the reference voltage range determination logic using the error-corrected tier 1-encoded first LSB page of data and the tier 1-encoded first MSB page of data to determine reference voltage ranges for a first MSB page of the flash memory cells of the first flash memory, and wherein the first flash memory programs the determined reference voltage ranges into the first flash memory and writes the tier 1-encoded first MSB page of data to the first MSB page of the flash memory cells.

3. The data storage system of claim 2, wherein the tier 1 ECC encoding performed by the tier 1 ECC encoder/decoder of the SSD controller is soft-decision ECC encoding and wherein the tier 2 encoding performed by the tier 2 ECC encoder/decoder of the SSD controller is hard-decision ECC encoding, and wherein the tier 2 ECC decoding logic of the first flash memory performs hard-decision ECC decoding.

4. The data storage system of claim 2, wherein during a normal LSB page read operation, the first flash memory reads the tier 1/tier 2-encoded first LSB page of data from the first LSB page of the flash memory cells of the first flash memory, discards tier 2 parity bits from the first LSB of read data to remove tier 2 decoding of the first LSB page of read data, and sends a tier 1-encoded first LSB page of read data to the SSD controller without the tier 2 ECC decoding logic of the first flash memory performing tier 2 ECC decoding of the tier 1/tier 2-encoded first LSB page of read data.

5. The data storage system of claim 4, wherein the tier 1-encoded first LSB page of read data that is sent from the first flash memory to the SSD controller is decoded by the tier 1 ECC encoder/decoder of the SSD controller to produce a tier 1-decoded first LSB page of read data.

6. The data storage system of claim 5, wherein during a normal MSB page read operation, the first flash memory causes the tier 1-encoded first MSB page of data to be read from the first MSB page of the flash memory cells and sent to the SSD controller, and wherein the tier 1-encoded first MSB page of read data that is sent from the first flash memory to the SSD controller is decoded by the tier 1 ECC encoder/decoder of the SSD controller to produce a tier 1-decoded first MSB page of read data.

7. The data storage system of claim 1, wherein the first flash memory is disposed in a first integrated circuit (IC) die and wherein the SSD controller is disposed on a second IC that is interfaced with the first IC to enable the first and second ICs to communicate with one another.

8. A first flash memory integrated circuit (IC) die for use in a solid state drive (SSD) of a data storage system, the first flash memory IC die comprising:
 a plurality of flash memory cells for storing data;
 error-correcting code (ECC) decoding logic, the first flash memory IC die being configured to receive write data from an interface that interfaces an SSD controller of the SSD with the first flash memory IC die, the received write data comprising at least a first least significant bit (LSB) page of data and at least a first most significant bit (MSB) page of data, the first LSB page of data being encoded with a tier 1 ECC encoding and with a tier 2 ECC encoding, the first MSB page of data being encoded with the tier 1 encoding, the first flash memory IC die programming the first LSB page of data to a first LSB page of the flash memory cells, wherein prior to the first flash memory IC die programming the first MSB page of data to a first MSB page of the flash memory cells, the first flash memory IC die causes the encoded first LSB page of data to be read from the first LSB page of the flash memory cells and sent to the ECC decoding logic, and wherein the ECC decoding logic performs tier 2 ECC decoding of the encoded LSB page data to produce a tier 2-decoded first LSB page of data.

9. The first flash memory IC die of claim 8, further comprising:
 reference voltage range determination logic for determining reference voltage ranges to be programmed into the flash cells, the reference voltage range determination logic using the tier 2-decoded first LSB page of data and the tier 1-encoded first MSB page of data to determine reference voltage ranges to be programmed for the first MSB page of flash memory cells.

10. The first flash memory die of claim 9, wherein the tier 1 ECC encoding is soft-decision ECC encoding and wherein the tier 2 encoding is hard-decision ECC encoding, and wherein the ECC decoding logic of the first flash memory IC die performs hard-decision ECC decoding.

11. The first flash memory IC die of claim 8, wherein during a normal LSB page read operation, the first flash memory IC die reads the tier 1/tier 2-encoded first LSB page of data from the first LSB page of the flash memory cells, discards tier 2 parity bits from the first LSB of read data to remove tier 2 decoding of the first LSB page of read data, and sends a tier 1-encoded first LSB page of read data to the interface without the ECC decoding logic of the first flash memory IC die performing tier 2 ECC decoding of the tier 1/tier 2-encoded first LSB page of data.

12. A method for programming data to flash memory of a data storage system, the method comprising:
 in a solid state drive (SSD) interfaced with a host system, receiving write data to be written to at least one nonvolatile memory (NVM), the write data comprising at least a first most significant bit (MSB) page of data and at least a first least significant bit (LSB) page of data, wherein the NVM includes at least a first flash memory having a plurality of flash memory cells, reference voltage range determination logic and tier 2 ECC decoding logic;

in an SSD controller of the SSD, receiving the write data to be written to the NVM, the SSD controller including at least one SSD processor, tier 1 error-correcting code (ECC) encoder/decoder, and tier 2 ECC encoder/decoder;

in the tier 1 ECC encoder/decoder, performing tier 1 ECC encoding of the first LSB page of data to produce a tier 1-encoded first LSB page of data;

in the tier 2 ECC encoder/decoder, performing tier 2 ECC encoding of the tier 1-encoded first LSB page of data to produce a tier 1/tier 2-encoded first LSB page data;

in the SSD controller, sending the tier 1/tier 2-encoded first LSB page of data to the first flash memory;

in the tier 1 ECC encoder/decoder, performing tier 1 ECC encoding of the first MSB page of data to produce a tier 1-encoded first MSB page of data; and in the SSD controller, sending the tier 1-encoded first MSB page of data to the first flash memory, the tier 1 ECC encoding and the tier 2 encoding being different types of encoding.

13. The method of claim 12, further comprising:
in the first flash memory, receiving the tier 1/tier 2-encoded first LSB page of data;
in the first flash memory, programming the tier 1/tier 2-encoded first LSB page of data to a first LSB page of the flash memory cells;
in the first flash memory, receiving the tier 1-encoded first MSB page of data;
in the tier 2 decoding logic of the first flash memory, performing tier 2 decoding of the tier 1/tier 2-encoded first LSB page of data that was programmed to the first LSB page of flash memory cells to produce a tier 2-decoded first LSB page of data; and
in the reference voltage range determination logic, prior to programming the tier 1-encoded first MSB page of data to a first MSB page of flash memory cells, using the tier 1-encoded first MSB page of data and the tier 2-decoded first LSB page of data to determine reference voltage ranges for the first MSB page of flash memory cells.

14. The method of claim 13, further comprising:
after determining the reference voltage ranges, programming the determined reference voltage ranges into the first MSB page of flash memory cells.

15. The method of claim 13, further comprising:
prior to programming the tier 1/tier 2-encoded first LSB page of data to the first LSB page of the flash memory cells, buffering the tier 1/tier 2-encoded first LSB page of data in a LSB page buffer portion of a buffer of the first flash memory; and after programming the tier 1/tier 2-encoded first LSB page of data to the first LSB page of the flash memory cells, buffering the tier 1-encoded first MSB page of data in an MSB page buffer portion of the buffer of the first flash memory.

16. The method of claim 15, further comprising:
after performing tier 2 decoding of the tier 1/tier 2-encoded first LSB page of data and prior to determining the reference voltage ranges:
loading the tier 2-decoded first LSB page of data into the LSB page buffer portion;
moving the tier 2-decoded first LSB page of data and the tier 1-encoded first MSB page of data from the LSB and MSB page buffer portions, respectively, to the reference voltage range determination logic.

17. The method of claim 14, wherein the tier 1 ECC encoding performed by the tier 1 ECC encoder/decoder of the SSD controller is soft-decision ECC encoding and wherein the tier 2 encoding performed by the tier 2 ECC encoder/decoder of the SSD controller is hard-decision ECC encoding, and wherein the tier 2 ECC decoding logic of the first flash memory performs hard-decision ECC decoding.

18. The method of claim 13, further comprising:
during a normal LSB page read operation, the first flash memory reading the tier 1/tier 2-encoded first LSB page of data from the first LSB page of the flash memory cells of the first flash memory, discarding tier 2 parity bits from the first LSB of read data to remove tier 2 decoding of the first LSB page of read data, and sending a tier 1-encoded first LSB page of read data to the SSD controller without the tier 2 ECC decoding logic of the first flash memory performing tier 2 ECC decoding of the tier 1/tier 2-encoded first LSB page of read data.

19. The method of claim 18, further comprising:
in the SSD controller, receiving the tier 1-encoded first LSB page of read data sent from the first flash memory to the SSD controller;
in the tier 1 ECC encoder/decoder of the SSD controller, decoding the tier 1-encoded first LSB page of read data to produce a tier 1-decoded first LSB page of read data.

20. The method of claim 19, further comprising:
during a normal MSB page read operation, the first flash memory causing the tier 1-encoded first MSB page of data to be read from the first MSB page of the flash memory cells of the first flash memory and sent to the SSD controller.

21. The method of claim 20, further comprising:
in the SSD controller, receiving the tier 1-encoded first MSB page of read data sent from the first flash memory to the SSD controller; and
in the tier 1 ECC encoder/decoder of the SSD controller, decoding the tier 1-encoded first MSB page of read data to produce a tier 1-decoded first MSB page of read data.

* * * * *